US009171458B2

(12) United States Patent
Salter

(10) Patent No.: US 9,171,458 B2
(45) Date of Patent: Oct. 27, 2015

(54) UTILITY MONITORING DEVICE, SYSTEM AND METHOD

(71) Applicant: Aztech Associates, Inc., Kingston (CA)

(72) Inventor: Geoffrey David Vincent Salter, Kingston (CA)

(73) Assignee: Aztech Associates, Inc., Kingston, Ontario (CA)

(*) Notice: Subject to any disclaimer, the term of this patent is extended or adjusted under 35 U.S.C. 154(b) by 431 days.

(21) Appl. No.: 13/660,502

(22) Filed: Oct. 25, 2012

(65) Prior Publication Data

US 2013/0187788 A1     Jul. 25, 2013

Related U.S. Application Data

(63) Continuation of application No. 12/525,415, filed as application No. PCT/CA2008/000208 on Feb. 4, 2008, now Pat. No. 8,325,057.

(60) Provisional application No. 60/887,985, filed on Feb. 2, 2007.

(51) Int. Cl.
*G08B 23/00* (2006.01)
*G08C 19/16* (2006.01)
(Continued)

(52) U.S. Cl.
CPC ............... *G08C 19/16* (2013.01); *G01D 4/002* (2013.01); *H04Q 9/00* (2013.01); *G01R 21/1333* (2013.01);
(Continued)

(58) Field of Classification Search
CPC . H04Q 9/00; H04Q 2209/60; H04Q 2209/40; H04Q 2209/43; H04Q 2209/47; H04Q 2209/883; Y04S 20/32; Y04S 20/42; Y04S 20/46; G01R 19/2513; G01R 22/063
USPC ................... 340/870.02; 396/351; 705/14.66; 348/61, 66; 359/629
See application file for complete search history.

(56) References Cited

U.S. PATENT DOCUMENTS

| 4,120,031 A | 10/1978 | Kincheloe et al. |
| 6,734,806 B1 | 5/2004 | Cratsley et al. |

(Continued)

FOREIGN PATENT DOCUMENTS

| CN | 1682137 | 10/2005 |
| GB | 2 420 863 | 6/2006 |

(Continued)

OTHER PUBLICATIONS

European Search Report, Application No. 08706345.9-1557, dated Jul. 29, 2013, (6 pages).
(Continued)

*Primary Examiner* — Jean B Jeanglaude
(74) *Attorney, Agent, or Firm* — Nixon Peabody LLP

(57) ABSTRACT

A monitoring device, system and method are provided for in-home/on-premises monitoring of usage of utilities, such as electricity and other services. The monitoring device receives information from a smart meter, and displays usage through a display, illuminating an area using a color indicative of the current cost of consumption, and varying the illuminated area at a rate indicative of a rate of consumption or other metric, the varying of the illuminated area simulating movement in the display. The display provides a consumer with "at a glance" visual information on current usage. Optionally a digital display screen provides detailed alphanumeric and graphical information, through a number of selectable display modes. One or more devices may be networked, and interface directly or indirectly with a transceiver of a smart metering system, or a retrofit transceiver for a conventional meter. Monitoring of other utilities and services may alternatively or additionally be provided.

7 Claims, 12 Drawing Sheets

(51) Int. Cl.
   *G01D 4/00*   (2006.01)
   *H04Q 9/00*   (2006.01)
   *G01R 21/133*   (2006.01)
   *G01R 22/06*   (2006.01)
   *G01R 22/10*   (2006.01)

(52) U.S. Cl.
   CPC ............... *G01R 22/063* (2013.01); *G01R 22/10* (2013.01); *H04Q 2209/25* (2013.01); *H04Q 2209/30* (2013.01); *H04Q 2209/43* (2013.01); *H04Q 2209/60* (2013.01); *Y02B 90/241* (2013.01); *Y02B 90/245* (2013.01); *Y04S 20/32* (2013.01); *Y04S 20/40* (2013.01); *Y04S 20/46* (2013.01)

(56) References Cited

U.S. PATENT DOCUMENTS

| | | | |
|---|---|---|---|
| 6,956,500 | B1 | 10/2005 | Ducharme et al. |
| 7,043,380 | B2 | 5/2006 | Rodenberg, III |
| 7,174,260 | B2 | 2/2007 | Tuff et al. |
| 2002/0105435 | A1 | 8/2002 | Yee et al. |
| 2003/0193405 | A1 | 10/2003 | Hunt et al. |
| 2004/0006439 | A1 | 1/2004 | Hunter |
| 2004/0174271 | A1* | 9/2004 | Welles et al. ............ 340/870.02 |
| 2004/0199477 | A1* | 10/2004 | Milanes Garcia-Moreno ............ 705/412 |
| 2004/0246143 | A1 | 12/2004 | Crichlow |
| 2005/0222784 | A1 | 10/2005 | Tuff et al. |
| 2005/0237959 | A1* | 10/2005 | Osterloh et al. ............... 370/310 |
| 2006/0007016 | A1* | 1/2006 | Borkowski et al. ...... 340/870.02 |
| 2006/0103549 | A1 | 5/2006 | Hunt et al. |
| 2006/0106741 | A1 | 5/2006 | Janarthanan |
| 2006/0158347 | A1* | 7/2006 | Roche et al. ............. 340/870.02 |
| 2007/0008171 | A1* | 1/2007 | Bowman ................. 340/870.02 |
| 2007/0013547 | A1* | 1/2007 | Boaz ....................... 340/870.02 |
| 2010/0060479 | A1 | 3/2010 | Salter |

FOREIGN PATENT DOCUMENTS

| | | |
|---|---|---|
| JP | 63-187996 | 8/1988 |
| JP | 06-034388 | 2/1994 |
| JP | 2002-063314 | 2/2002 |
| JP | 2005-352631 | 12/2005 |
| WO | 2008/092268 | 8/2008 |

OTHER PUBLICATIONS

International Search Report, PCT/CA2008/000208, Date of mailing Jun. 8, 2008, 2 pages.
International Written Opinion, PCT/CA2008/000208, Date of mailing Jun. 8, 2008, 5 pages.

* cited by examiner

UTILITY MONITORING DEVICE, SYSTEM AND METHOD

CROSS-REFERENCE TO RELATED APPLICATION

This application is a continuation of and claims priority from U.S. patent application Ser. No. 12/525,415, filed Jul. 31, 2009, which claims priority to PCT Application No. PCT/CA2008/00208, filed Feb. 4, 2008 and U.S. Provisional Application No. 60/887,985, filed Feb. 2, 2007, each of which is herein incorporated by reference in its entirety.

TECHNICAL FIELD

This invention relates to a utility monitoring device, system and method for monitoring usage of utility services such as the supply of electricity, gas, water or other commodities (services), and is especially applicable to so-called smart metering systems and on-premises (e.g., in-home) monitoring devices for monitoring consumption of utilities to provide information on current and cumulative usage by consumers.

BACKGROUND ART

Residential, commercial and industrial establishments are typically provided with meters for measuring consumption of commodities, including electricity, gas and water, and other services, supplied to a building by utilities. For example, an electricity provider typically provides each consumer's premises with a conventional electricity meter having a rotating disc and counter to measure and indicate cumulative usage in kilowatt hours (kWh), as a measure of usage or consumption of electrical energy for billing the consumer. Similar meters may be provided for gas, water or other services/supplies.

More recently, many utility companies and government agencies have been installing "smart meters" which can record cumulative or total energy usage and transmit the data to a central location, avoiding the need to employ a fleet of meter readers to take meter readings. Smart metering systems also facilitate data collection in terms of speed, accuracy and total cost of collection. Moreover, smart metering allows for more detailed monitoring of time of use, cost and other data. Most smart meters are configured to monitor usage and apply different rates or tariffs for energy usage based on a current rate period or time of use period. Typical resolution of time measurement is 15 minute or 60 minute intervals. A number of different rate periods and corresponding rates may be established based on time of day (e.g. peak rates and off-peak rates), day of the week, month, season, varying cost of supply or other factors. Other utilities set tiered rates based on consumption levels. Thus utilities and local distribution companies can set different tariffs for usage depending on a rate period. Consumers may regulate their consumption accordingly, for example by deferring use to a lower cost, off peak rate period.

Introduction of smart metering by utility companies and service providers is driven in part by the need to encourage reduced consumption during peak hours, and typically several tariffs are provided dependent on time of use (e.g. peak/off-peak) to provide a cost incentive for off peak use, or energy conservation during peak periods. For electricity generation, off-peak use spreads demand on the system for improved power management at peak demand, which is particularly important in climates placing extreme demands on provisioning for peak periods (heating during winter months and cooling during summer months).

Nevertheless, even with smart metering, the consumer may not receive information on consumption and cost from the utility provider until a billing is received. Furthermore, since conventional and smart meters are typically located on the outside of a building, consumers need more convenient ways to monitor current consumption and cost in real-time, for example from within the home.

Smart meter systems are typically networked, through wired or wireless networks, to provide for remote monitoring and meter reading by utility/service providers. Consequently there are a number of known systems for providing consumers with information on their usage, for example in-home or on-premises displays which may be linked to the smart meter using wireless or wired connections. Smart meters may communicate with other devices such as remote appliance controllers (RACs), programmable communicating thermostats (PCTs) and in-home displays (IHD) for energy management etc. These in-home or in-building displays typically have a digital display to indicate usage information, such as consumption, and may provide for simple graphical representations of information, indicator lights and audible warnings.

Wirelessly-enabled smart metering and monitoring systems may rely on a number of known wireless networking, or mesh and sensor networking protocols depending on range of transmission and security requirements (e.g. based on IEEE 802.15.4, ANSI C12.19, C12.22, Zigbee).

Where smart meters are not installed, several retrofit solutions may be offered for automatically reading data from conventional meters and transmitting data wirelessly or through wired network connections.

For example, the "Power cost" monitor by Blue Line Innovations, described in US published patent application No. 2005/0222784 (now U.S. Pat. No. 7,174,260), provides a digital display capable of displaying several parameters and graphically representing data in real time relating to energy usage and cost, together with related information such as outside temperature. This monitor includes a numeric display, with a graphical display of a spinning wheel to indicate power consumption rate (disk emulator). In this example, in-home units may communicate with a sensor device attached to the exterior of a conventional electricity meter which senses the rotation of the wheel and communicates the information to the in-home monitor by way of a wireless link.

Where smart metering is available, there are a number of digital displays available to consumers for displaying numeric and simple graphical information. These may be wall-mounted like a wall thermostat, or plug-in to an electrical wall outlet, and may receive information from a meter system through wired or wireless connections.

Other examples of electrical power usage monitors are: the Ritetemp universal wireless thermostat by Golden Power Manufacturing, which includes coloured light utility rate indicators; Ambient digital graphical displays, which include the Energy Joule display which plugs into an electricity outlet and provides available displays coloured backlighting depending on rate; other displays also provide related weather and temperature information. Another plug-in unit marketed as Powerstat by TWACS by DCSI provides audible and visual alerts; Powerwatch provides secure wireless monitoring with data feed to a watch-type monitor worn on the wrist.

Another manufacturer, EcoMeter manufactures display units with digital graphical displays, for monitoring both energy and water usage; a set of LEDs along the bottom of the screen indicate tariff periods by colours: green for off-peak; yellow for shoulder tariff; orange for peak tariff; red for dynamic peak tariff/high demand. This device also translates energy usage to greenhouse gas emissions equivalents.

Although a number of in-home (in-building, on-premises) displays are available, existing products have some limitations, and may not be compatible with known smart metering systems. Some of the units require a consumer to be aware of any changes in status, and be close enough to read and interpret data on the display. Furthermore, where units plug into an electrical wall outlet, there are limitations on placement and the device may not be conveniently located for reading of a digital display.

Some users also want to know their current energy usage, either in terms of current cost (in a currency unit, such as dollars or cents) or in units of measurement of energy (such as kilowatt hours). Some smart meters may not provide information on rate period, and even when information is available, consumers may not be able to immediately interpret numeric data without analysis because there are several types of billing: e.g. single flat rate mode; tiered rate mode; time-of-use rate modes.

As mentioned above, some approaches exist to transmit energy usage data from a smart meter to a central station, or possibly even to a location within a building, for reading by a user. When smart meters are not installed, such approaches often require an electrician to install specialized equipment connected to a conventional meter, and the equipment generally requires a separate power supply or power source.

Increasing energy and fuel and other costs, and concern for the environmental impact of energy and resource demands, provide incentives for smart metering of utilities providing improved monitoring of usage, time of use dependent rates, and feedback to the both the utility company and consumers.

It is understood that the success of such smart meter initiatives largely depends on the extent to which energy consumers, such as electricity consumers, are able to use smart metering to take advantage of opportunities for conservation and better manage their consumption and, as a result, their energy costs.

It is, therefore, desirable to provide an apparatus that can provide an indication of current energy usage with respect to a provided service, such as electricity, in relation to an applicable rate period. To encourage reduced demand at peak periods, and conservation, there is a need for improved devices that are relatively inexpensive yet provide consumers with a convenient, visual indication of current (real-time) usage in terms of cost and consumption for electricity usage and usage of other services.

DISCLOSURE OF INVENTION

The present invention seeks to overcome, or at least ameliorate, one or more of the disadvantages of these known monitoring devices and systems, or at least provide an alternative.

According to one aspect of the present invention, there is provided a monitoring device for in-building monitoring of usage of a commodity supplied by a utility and displaying at least two usage metrics, comprising:

receiver means for receiving information relating to at least a first of said two usage metrics, said first usage metric relating to present consumption rate or present aggregate consumption of the commodity;

display means having a display area:

light source means for selectively illuminating at least part of the display area with light of a selected one of a plurality of colours and varying the illuminated area; and control means responsive to the receiver means for controlling the light source means to select the illumination colour and to vary the illuminated area, the colour selection and area variation being indicative of respective ones of the at least two usage metrics.

Preferably, the colour indicates a usage metric related to cost of consumption at present, and the variation in the illuminated area indicates the rate at which such consumption is taking place.

Advantageously, the present consumption rate may be indicated by scanning illumination of a part of the display area over the display area at a traverse rate indicative of a rate of consumption.

Thus, an in-home, or in-building, monitoring device is provided having an illuminated display which provides consumers with an "at a glance" indication of both a current cost of consumption, as indicated by the colour of the display, and a rate of consumption indicated by scanning or movement of the illumination across the display area, which advantageously may simulate motion or rotation across the display area at a rate indicative of the rate of consumption, or other usage metric.

Preferably, the control means provides for modulating the output of the light source means to create a pattern of illumination of the display area simulating one of linear motion or rotation traversing the display area at a traverse speed dependent on a rate of consumption.

Beneficially, a second display may also be provided, comprising a digital display for displaying at least one of alphanumeric and graphical information. The second display may, for example, comprise an LCD screen, capable of displaying more-detailed information on current and cumulative usage and cost. For an electricity monitoring system, this information may include for example, current demand, price and consumption data, current usage in kW, cumulative consumption during the day, or preceding month, or other time period in kWh, consumption for each rate period, and corresponding cost information such as cost by day, month, or cost incurred for different rate periods, and so on.

Where the monitoring device comprises a second display, such as an LCD screen, the device may include means for selecting one of a plurality of display modes of the digital display. For example, the monitoring device may comprise push buttons for selecting different display modes, displaying various selected sets of information alphanumerically and graphically. The device may optionally comprise an audible alerter.

Where the display area is elongate, the light sources may be arranged as a linear array, and the control means then may provide for scanning illumination of the array along a length of the display area at a traverse rate indicative of rate of consumption to simulate linear motion of the illumination across the display area. Simple examples would be slow sequential illumination of diodes in one row of LEDs to indicate progress through a rate period, or faster sequential and repetitive illumination of a row of LEDs at a rate indicative of a rate of consumption typical of a movie marquee pattern.

The elongate display area may be arcuate, and the light sources arranged as a corresponding arcuate array, and the control means then may comprise a controller for selectively activating light sources in the array in sequence for scanning illumination along a length of the arc at a traverse rate indicative of a rate of consumption.

Advantageously, the light source means may include a modulator for modulating
(e.g. pulsing) output of the light source for displaying one of a plurality of different colours, each colour associated with a specific rate tier, rate tariff or other cost parameter. Where cost information is based on a rate tier or rate tariff, each rate tier or rate tariff may be associated with a specific colour of the display.

Preferably, the light source means comprises an array of light emitting elements such as LEDs, and the control means comprises a controller for selectively illuminating one or more light emitting sources of the array to selectively illuminate parts of the display area with a selected colour. The array of light emitting sources may comprise, for example, an array of light emitting diodes (LEDs), organic LEDs (OLEDs); or the light source means may be an electroluminescent membrane light source or other known controllable source.

Displays may, for example, use bi-colour or tri-colour LEDs to generate a desired set of colours indicative of different rate periods or time of use periods, such as off peak, mid peak or peak tariffs. Alternatively the controller may provide for scanning of illumination of the diode array in more complex sequences to provide one of a plurality of patterns of illumination changing a desired speed and traverse direction, such as sequences known as "marquee chasing" patterns with various speeds and directions, which are selected to indicate usage information.

Where a larger display area or a curved or arcuate display is provided, patterns of illumination of an array of LEDs may be used to emulate rotation of a conventional mechanical electricity meter disc or wheel, or other linear or rotational motion of a light pattern in the illuminated display at a rate dependent on a parameter being monitored.

The illuminated display may comprise a window or lens in an opening in a casing of the monitoring device aligned with the light source array; or a translucent part of the casing of the monitoring device overlying the light source array.

Preferably, the illuminated display has an ornamental as well as a functional design. As is conventional, optical means such as reflectors, lenses, prisms and other light guides or optical fibres may be used to couple light from individual sources or from the light source array, to provide the desired illumination pattern in the display area.

The receiver means may be capable of receiving information through a wired or wireless connection directly from a smart metering system, i.e. directly from a smart meter having a transmitter or transceiver, from a transmitter/transceiver adapter coupled to a conventional meter, or from a utility company network. Beneficially the monitoring device may also have a transceiver for receiving information from and transmitting information to one or both of the smart metering system and other monitoring devices.

The device may have a port for power input and/or a network connection. Additionally or alternatively, the device may be battery powered in known manner.

Beneficially, the monitoring device may comprise a transceiver for receiving said information from a metering system, and transmitting information to a data repository or other devices, to provide for two way messaging, and may provide for communication using one or more known wireless network protocols. The device may be configured to send a message to a consumer, for example to turn off appliances at a critical peak period if consumption reaches a threshold, and optionally includes means responsive to user input to provide power management (e.g. shut down air conditioning during a critical use period, or power up during an off-peak use period).

Conveniently the casing of the monitoring device may provide for wall mounting or table-top display of the monitoring device. Where the illuminated visual display comprises a translucent top part of the casing, the illuminated surface area may be designed to be visible from a wide viewing angle.

According to a second aspect of the invention, there is provided a method of monitoring utility usage and displaying at lease two usage metrics contemporaneously, comprising:

receiving from a metering system information relating to at least a first of said two usage metrics, said first metric being information related to a present consumption rate or present aggregate consumption;

visually displaying information related to the at least two usage metrics by illuminating part of a display area of a monitoring device with a colour indicative of one of the two usage metrics, and varying the illuminated area in a manner indicative of the other of the two usage metrics.

Preferably, the illumination is varied to illuminate parts of the display area sequentially to simulate one of linear motion or rotation of the coloured illumination across the display area at a traverse rate indicative of a rate of consumption.

Each different rate tier may be associated with a different colour, and the respective colour selected dependent on a rate of consumption. Green, yellow, orange and red illumination may, for example, be used to indicate respectively off-peak, mid-peak, on-peak and critical peak, providing the consumer with instant awareness of energy consumption levels and rate in a manner which is readily interpreted.

The method may also comprise displaying utility usage information on a second (digital) display, numerically and/or graphically, said usage information comprising, for example, current and cumulative consumption, price, time and date, etc. The second display's content may be selected by the consumer, conveniently by means of pushbuttons on the monitoring device.

According to yet another aspect of the invention, there is provided a transceiver/transmitter adapter for mounting between an electricity meter and a receptacle for the meter and which comprises a substrate carrying a transceiver for communicating usage information to the receiver of an in-building monitoring device.

Advantageously, the adapter comprises a power supply unit which receives power directly from the receptacle, often referred to as a meter base, and a transmitter, conveniently part of a transceiver, for transmitting a first usage metric relating to consumption rate or aggregate consumption to the monitoring device using, for example, wireless transmission at one or more frequencies, using known wireless network protocols.

Such meter bases are of a specific type for residences—referred to as a form 1 S or 2 S meter base.

Where smart metering is not implemented, the transceiver adapter may be installed under a conventional meter, plugging into the meter socket, and be sandwiched between the meter socket and the meter itself without necessitating breaking of the seal on the meter case. Hence, the meter will stay sealed and calibrated, though the utility's theft protection seal, as stalled by utility-authorized individuals, will be broken.

The adapter may comprise a set of pass-through terminals each having a plug at one end to connect to a socket in the receptacle and a socket at an opposite end to receive a corresponding plug on the meter.

Where the adapter has pass-through terminals, the power supply unit may comprise coils wound around respective ones of the terminals to form current transformers.

Such a transceiver adapter may be readily installed by a technician from the utility company.

According to still another aspect of the invention, there is provided a monitoring device for in-building monitoring of usage of a commodity supplied by a utility, characterized by receiver means for receiving information relating to a present rate of consumption of the commodity; display means; and control means responsive to the receiver means for controlling the display to depict the present consumption rate in terms of an equivalent number of light bulbs each of a given wattage.

The illuminated design of the display for the monitoring device preferably is configured to be ornamental as well as functional to encourage placement of one or more of these devices in prominent locations in the home to alert all household members to energy usage rate and encourage conservation. Such locations may be where energy consuming appliances are located, for example a kitchen, or laundry area.

Advantageously, the specific arrangements of the display allow for the illuminated display to be viewed from a number of angles when placed on a table top to facilitate at "a glance monitoring" through colour and position or linear/angular motion of the illumination of the display. Alternatively such models may be wall mounted, or mounted (e.g., magnetically) on a refrigerator.

Devices may also be placed, for example, near the front door to alert the home owner of status of consumption when leaving or entering the home.

An energy monitoring system may also be provided comprising a plurality of monitoring devices, one of more of such devices being provided with a port for a network connection, such as via a USB connection, or other known network connection type, to allow data to be transferred to a data repository or other device.

BRIEF DESCRIPTION OF THE DRAWINGS

Embodiments of the present invention will now be described, by way of example only, with reference to the attached Figures, wherein:

FIG. 14A is a side view of a sixth embodiment of the invention which is similar to the monitoring device of FIG. 1 but has a light guide whose exterior edge is stepped to provide three parallel oblique display areas, while

DETAILED DESCRIPTION OF PREFERRED EMBODIMENTS

Figure 1:
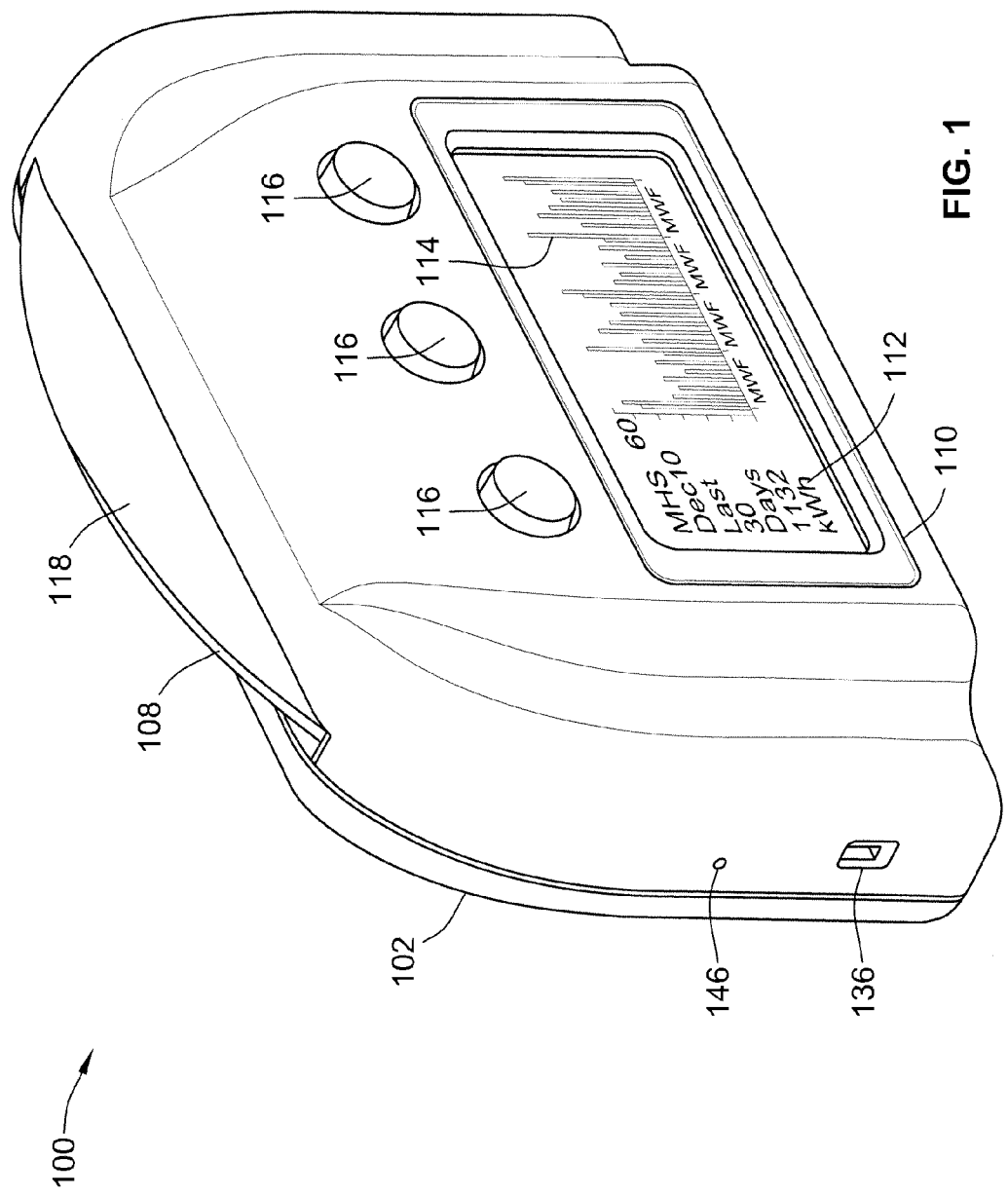
FIG. 1 is a schematic perspective view of a monitoring device according to a first embodiment of the present invention.

Similar elements in the different Figures have corresponding reference numbers, those of a particular embodiment differing by 1000 from those of other embodiments.

A monitoring device 100 according to a first embodiment of the present invention will now be described with reference to FIGS. 1, 2 and 3. The monitoring device 100 comprises a casing 102 enclosing a radio receiver 104 (see FIGS. 2 and 3) coupled to a dipole antenna 106 (and/or other external/internal antenna) for receiving usage information from a metering system, and having an illuminated display area 108, and a digital display 110, the latter being, in this instance an LCD screen, for example a 64×128 resolution LCD display, for displaying alphanumeric 112 and/or graphical information 114 in one or more modes. The monitoring device 100 also has three multifunction and user-actuated pushbuttons 116 for turning the device on and off and for selecting display modes for displaying different sets of information as will be described in more detail with reference to FIGS. 5A to 5O.

The casing 102 comprises a moulded plastic casing suitable for wall mounting or table-top display.

In this embodiment the illuminated display 108 comprises a frosted, arcuate, generally linear obliquely-angled outermost end surface of a light guide 118 extending from a top of the casing 102. The display surface 108 faces towards the rear of the casing 102 but reflects light impinging upon from the interior end of the light guide 118 so that it emanates forwardly of the casing 102. Parts of the arcuate display area 108 may be selectively and sequentially illuminated by light launched into the light guide from an array of light sources, specifically LEDs 120 (see FIGS. 2 and 3) within the casing 102. Thus, the light guide 118 constitutes optical coupling means for directing light from the array of LEDs 120 to illuminate selected parts of the arcuate display area 108.

Figure 2:
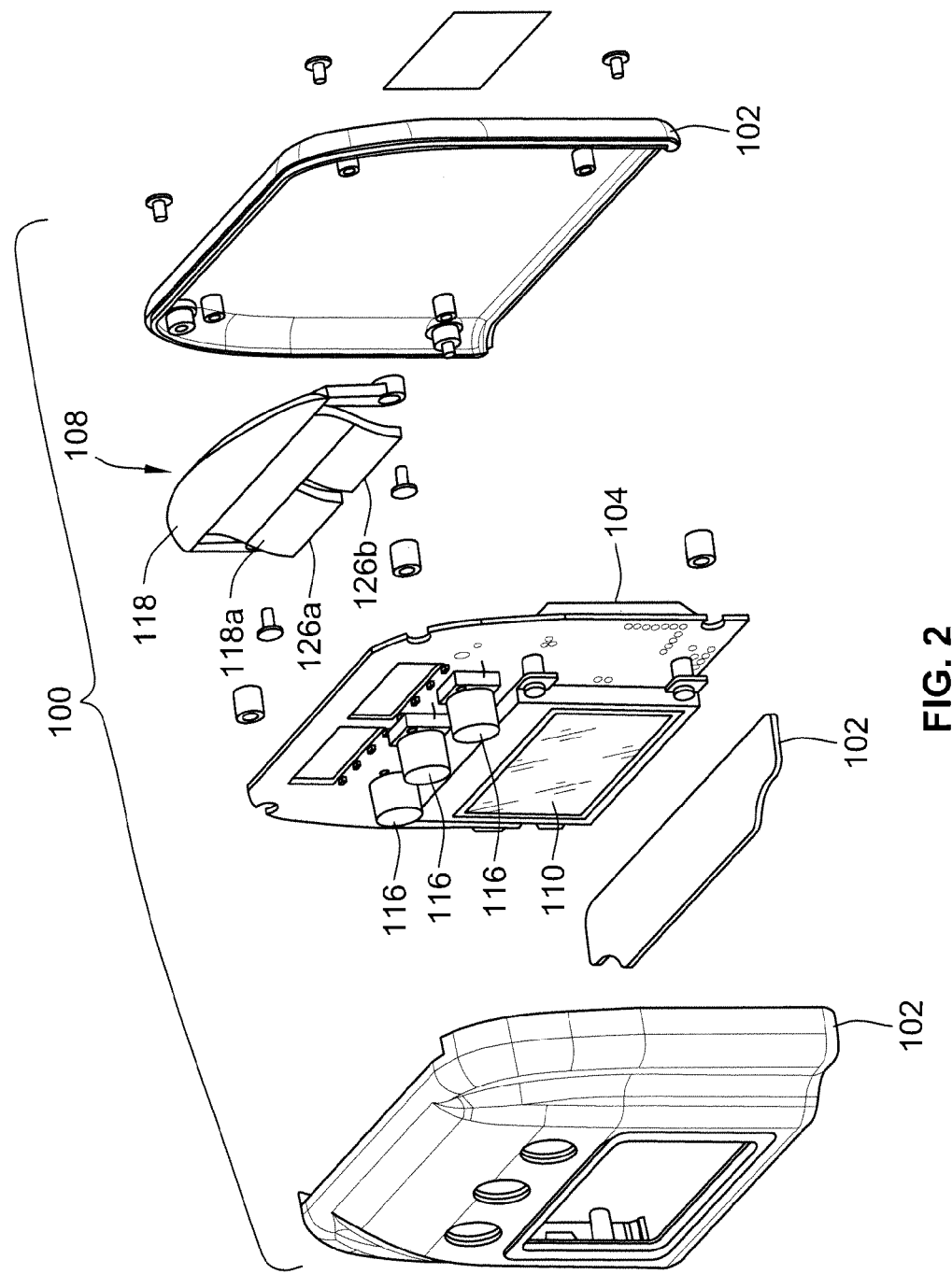
FIG. 2 is an exploded view of the monitoring device of FIG. 1.
Figure 3:
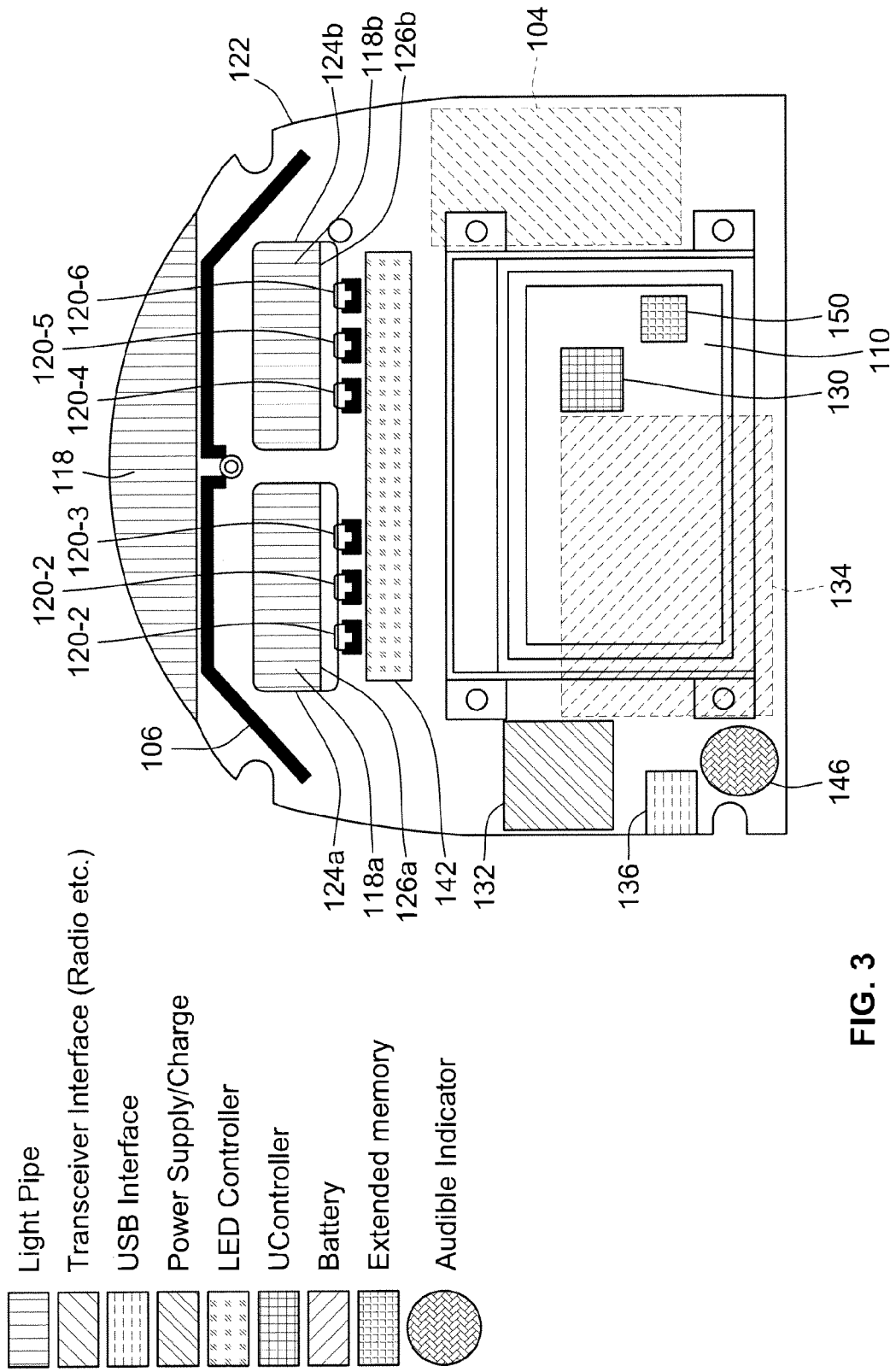
FIG. 3 illustrates the layout of a circuit board and internal components of the monitoring device of FIG. 1.

As shown in FIGS. 2 and 3, the array comprises six bi-colour LEDs 120/1 to 120/6 provided on an internal circuit board 122 (not visible in FIG. 1).

At its interior end portion, the light guide 118 has two curved tongue portions 118a and 118b which protrude through rectangular holes 124a and 124b, respectively, so that endmost surfaces 126a and 126b are in close proximity to the LEDs 120 and light therefrom couples into the lightguide 118. Generally, each LED will illuminate a corresponding segment or part of the arcuate surface 108. It will be appreciated, however, that the transitions between adjacent segments, when illuminated, will not be sharply defined due to specular scattering and diffusion effects.

Figure 4:
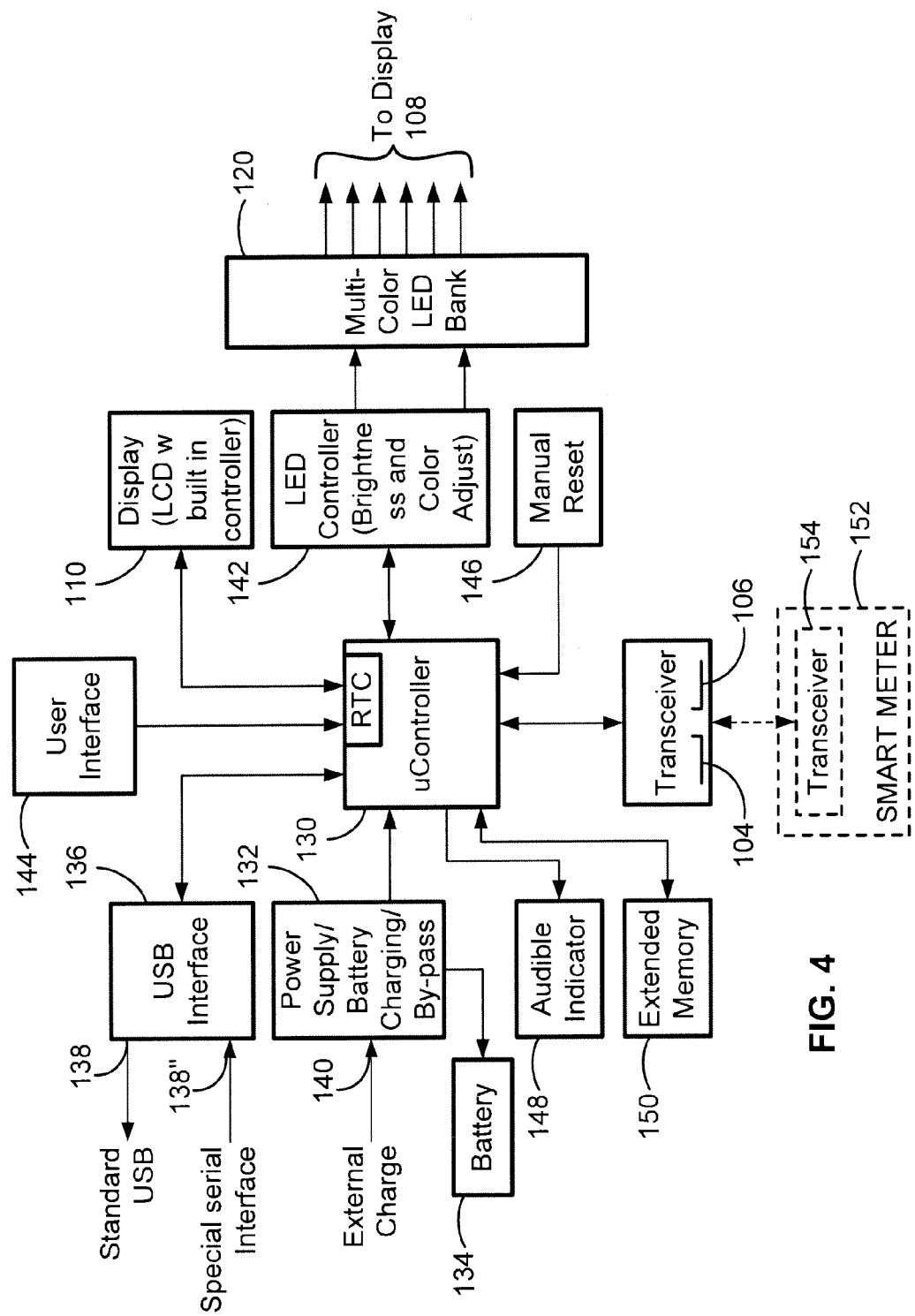
FIG. 4 is a corresponding schematic block diagram of the monitoring device of FIGS. 1, 2 and 3.

FIG. 4 shows a schematic block diagram of the components inside the monitoring device shown in FIGS. 1, 2 and 3. Receiver 104, actually part of a transceiver, receives information from a corresponding transmitter of a smart metering system and conveys the information to a microcontroller 130, which is powered as is conventional from a power supply 132, with an optional battery 134. Also provided is an interface unit 136 which is connected to the USB port 138 for a standard USB network connection and/or to a specialized connection port 138". The power supply 132 is shown with a port 140 (optional) for connection to an external source to charge the battery (if rechargeable).

The information includes at least one usage metric related to a present rate of consumption. The receiver may also receive from the smart meter data such as time of use, current rate period and associated tariff, energy usage in energy and/or currency units, and cumulative usage or usage history, though, in preferred embodiments, such additional data is provided within the monitoring device itself; time of day from an internal clock, other data previously stored in a memory device, and so on, especially if the monitoring device is able to communicate with the utility company and receive updates.

The receiver may be combined with a transmitter, i.e. in a transceiver, enabling it to exchange information with a complementary transceiver at the meter, the utility or utility related transceivers—(fixed or mobile)

The multicoloured LED bank or array 120 for illuminating the display 108 (not shown in FIG. 3) is linked to the microcontroller 130 via LED control unit 142 which will be described in more detail below. The second display, in the form of LCD screen 110, has a built in controller (not shown) which communicates with the microcontroller 130, and there is a user interface 144 which couples the pushbuttons 116 (including a power on/off pushbutton) to the microcontroller 130 for selecting a display mode for the LCD display 110. Other elements linked to the microcontroller 130 include a manual reset 146, an audible indicator or alerter module 148 and an extended memory module 150.

Referring to FIG. 4, drive current for the bi-colour LEDs 120 is supplied by LED control circuitry 142 under the control of microcontroller 130. Such a bi-colour LED usually comprises a group of two closely-spaced LED elements co-packaged, for emitting red and green light, respectively. The microcontroller 130 will energize the R, G LEDs individually or in combination to obtain the colour to be emitted. For example, red may indicate "critical" peak tariff, orange indicate "peak" tariff, yellow "mid-peak" tariff and green low-peak tariff. In addition, the microcontroller 130 will energize the bicolour LEDs selectively so as to illuminate different parts of display surface 108 in a sequence or pattern. Thus, the microcontroller 130 may cause the individual bi-colour LEDs to be energized so that the coloured light will move along the arcuate display area 106 in a manner indicative of the usage metric received from or calculated from the meter, i.e., consumption rate.

In some cases, the information from the meter may comprise only a measure of the aggregate consumption of the electrical power being drawn, in which case the microcontroller 130 will use its internal clock to determine consumption rate. The microcontroller 130 will access internal memory and/or extended memory 150 to obtain other data, such as pricing tiers or tariff rates.

Pricing "tiers" may be determined temporally, e.g., cost of a present unit is determined by the time/day/month/year it is consumed, or volumetrically, e.g., cost of a present unit is determined according to how many units have been consumed previously (since a certain datum). In the latter case, the tiers might be defined by a series of threshold levels at each of which the cost-per-unit increased.

It is envisaged that the illuminated display could also indicate an impending transition to a different tier, for example by illuminating a separate LED and display area or by merging colours (fade out-fade in).

So, for example, during an off peak rate period, the display colour would be green, and each of the bi-colour LEDs 120 would be energized to emit that colour (specifically by activating the green LED in its group) and illuminate a corresponding area of the display 108. At a consumption rate, the LEDs 120 would be energized in sequence so that discrete areas or segments of display area 108 would be illuminated in turn, effectively causing an illuminated green segment to move slowly along the length of the arcuate display 108. As the consumption rate increased, the controller 130 would increase the sequence rate and thereby increase the speed at which the green segment travelled along the arcuate path. The movement of the illumination pattern visually simulates rotation of a disc of a conventional electricity meter at a speed indicative of consumption rate.

As the rate period changes from mid-peak to peak tariff, the controller 130 will cause the LEDs to emit orange and then red light. The controller 130 may also turn the LEDs 120 on and off to cause the display light to flash a particular colour and thereby indicate a critical peak tariff period. Of course, some other modulation pattern could be used to the same end.

Audible indicator 148 may be used to sound audible alerts. An insistent stoppable alarm may be associated with a critical peak, whereas a softer alarm may indicate a countdown to a next rate period.

The illuminated display could be arranged to indicate elapsed time with respect to a rate period, e.g., indicating whether current time is near a beginning or end of a particular "time of use" rate period. For example, illuminating an area extending along three-quarters of the length of the arcuate surface 108 might indicate that the present time of day is three-quarters of the way through the rate period associated with the colour displayed. (See FIGS. 17A to 17F).

As is well known, the human eye responds quickly to perceived movement, so, beneficially, a change in colour and a moving pattern of light are effective in alerting consumers to a change in consumption rate and cost in such a way that the information can be assimilated quickly, "at a glance". This is especially so when the moving pattern simulates linear or rotational motion. In catching attention, scanning of the illumination across the display at a defined traverse speed may be preferred to a stationary blinking or flashing light, which may be seen as intrusive or irritating.

The second, digital display, specifically LCD screen 110, is used for displaying more detailed information of these and/or other metrics or parameters relating to current or cumulative usage. Examples include graphical display of hourly usage, e.g. for the last 24 hours in $ or kWh; daily usage for the last 30 rolling days in $ or kWh; totals for each individual Time of Use (TOU) period combined in kWh and $; instantaneous or average demand consumption, showing power currently being used.

Figures 5A, 5B, 5C, 5D, 5E, 5F, 5G, 5H, 5I, 5J, 5K, 5L, 5M, 5N, 5O:
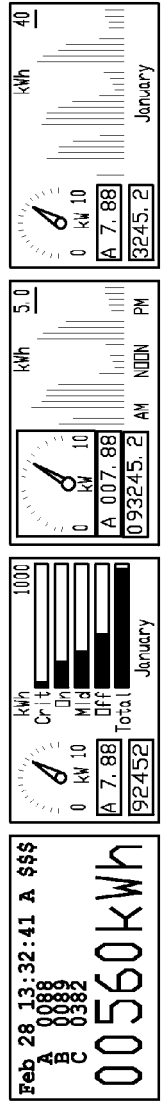
FIGS. 5A to 5O illustrate typical displays provided by a data display of the device.

The actual data displayed may be selected using one or more of the pushbuttons 116. FIGS. 5A to 5O illustrate examples of data displayed by the second display 110, as follows:

FIG. 5A—Absolute kWh reading from total and three tiers from meter tables;

FIG. 5B—Analogue "Speedometer" showing current consumption, bars showing monthly total for 3 standard tiers and critical peak; "A" short term total (day/week) and total;

FIG. 5C—Analogue "Speedometer" showing current consumption, bars showing hourly total for one day, "A" short term (day/week) and total;

FIG. 5D—Analogue "Speedometer" showing current consumption, bars showing daily total for the month, "A" short term (day/week) and total;

FIG. 5E—Consumption in cost tiers represented by $ . . . $$$$ with a base amount;

FIG. 5F—Cost per tier represented by $ . . . $$$$ with a base amount;

FIG. 5G—Bars depicting daily total, day, in dollars/day & total $$;

FIG. 5H—Bars depicting daily total day, in kWh/day & total kWh;

FIG. 5I—Consumption in cost tiers represented by $.$$$$ with no base amount;

FIG. 5J—Current (instantaneous) consumption depicted using 1OO W light bulb graphics icons;

FIG. 5K—Current (instantaneous) consumption in kW;

FIG. 5L—Consumption total for a user-selected time frame with average consumption and a sub-interval;

FIG. 5M—Consumption total for a user-selected time in kWh and dollars;

FIG. 5N—Bars depicting hourly total, for one day, in dollars per hour and total dollars; and FIG. 5O—Bars depicting hourly total, for one day, in kWh per hour and total kWh.

Because the second display 110 is digital, it is a very simple matter to change the data which can be displayed, the different display screens being selected, as mentioned, by means of one or more of the pushbuttons 116.

Many consumers do not fully appreciate the implications of energy consumption rates when expressed numerically, so the data display shown in FIG. 5J is particularly advantageous because it depicts the consumption rate as a equivalent number of light bulbs of a given (common) wattage, for example 6O W or 1OO W. Most consumers will appreciate the significance of a large number of these "light bulb units of energy" being displayed during a critical, high tariff period and be motivated to check for appliances which can be turned off, at least temporarily.

Data port 138, for receiving a USB or other data connector, such as a network connector (not shown), and connected to data interface unit 136, enables data to be outputted, under the control of controller 130, perhaps for analysis or storage, to a personal computer or personal digital assistant. Although a USB port is indicated, data interface 136 might use one or more other kinds of data transmission mode, such as infrared, Bluetooth, and so on, or even connect to a network (Ethernet, Internet) to transmit data to the utility or elsewhere. It might also be capable of downloading data to update data, such as tariff rates, stored in the memory 150. Moreover, it may also be used to connect a power supply, with appropriate modification of the connections within the monitoring device, For Power Line Communication (PLC) type meter systems, the data interface 136 also has a serial input port 138".

It should be noted that the receiver 104 of the above-described monitoring device could be part of a transceiver, the transmitter part being used to communicate with the utility meter and/or the utility company.

As shown in broken lines in FIG. 4, a typical smart meter 152 has its own receiver (usually part of a transceiver) 154 which can transmit usage data to the utility company and receive software and/or data updates. In many cases, the receiver 104 of the monitoring unit 100 will be able to communicate with the transceiver 154, any proprietary transmission protocol being licensed as necessary. The receiver 104 may be programmable to adapt it for use with different types of smart meter. Alternatively, several interchangeable dedicated receiver/transceiver modules 104 may be provided, each for a particular type of meter transceiver, and the appropriate one selected and installed onto the circuit board 122.

Figure 6:
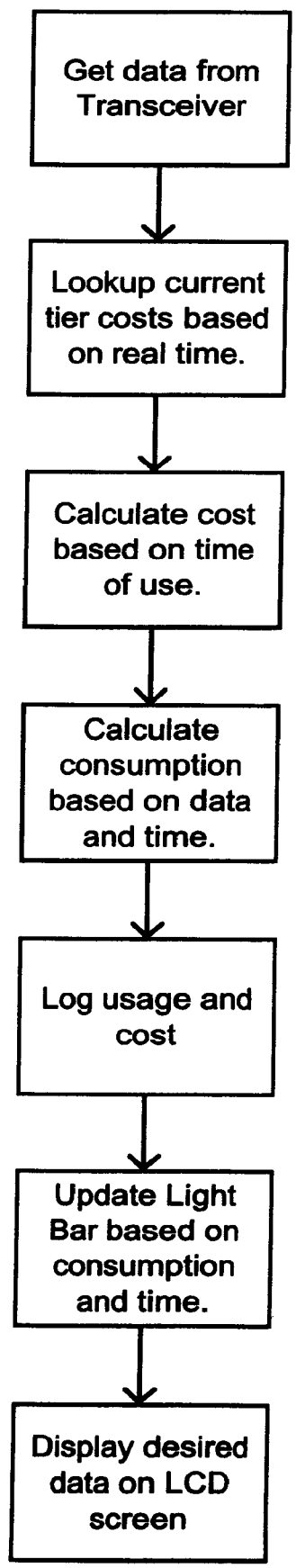
FIG. 6 is a flowchart depicting operation overall operation of a microcontroller of the monitoring device.

FIG. 6 is a simple flowchart depicting the basic operation of the microcontroller 130 as it controls the acquisition of the data for the different usage metrics, either via the receiver 104, from look-up tables in the memory 150 or even by communicating with the utility, computing the information to be displayed, and then controlling the two displays 108 and 110 to display the data. It should be noted that, depending upon the model, the meter transceiver 154 may transmit either or both of the present consumption rate and the present aggregate consumption; in the latter case, the microcontroller 130 will use its own internal clock to convert successive aggregate consumption readings into a consumption rate.

Although the above-described embodiment is designed to communicate with a smart meter having its own transmitter (transceiver), the monitoring device 100 may be used with a conventional electricity meter by installing a suitable transmitter/transceiver adapter at the meter. Such an adapter might take the form of an external sensor clamped to the meter case and having a sensor for detecting a mark on the usual spinning wheel, as disclosed in the afore-mentioned US published patent application No. 2005/0222784US, but that is not preferred because it can miscount and be tampered with too easily; utilities prefer that users do not interfere with the meter; cold or heat can cause the clamp to slip and the sensor to lose alignment; a nick in the plastic housing of the meter by the metal clamp or tool used to tighten it can start a stress fracture in the plastic which will render the seal to weather elements void; and it requires a separate battery.

Figure 7:
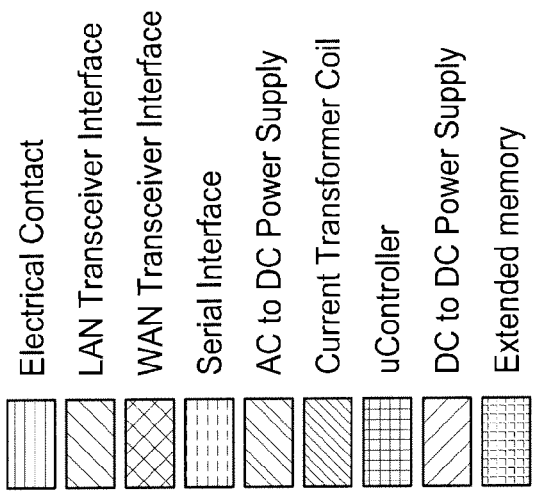
FIG. 7 is a schematic diagram of a transceiver adapter for installation between a meter and a meter base.
Figure 7:
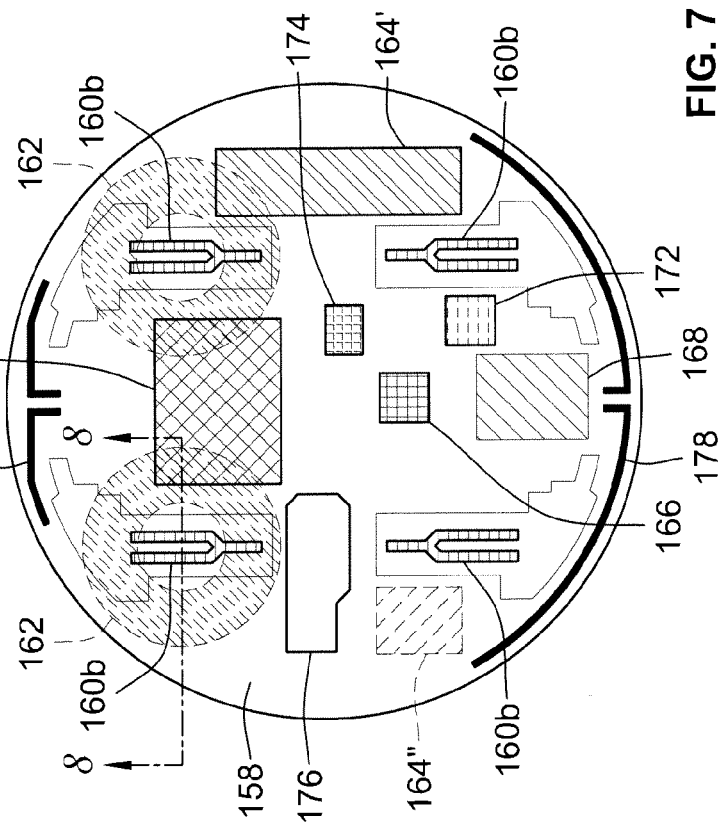
Figure 8:
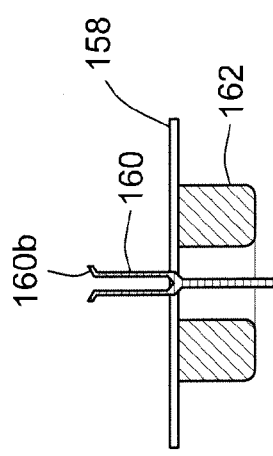
FIG. 8 is a partial longitudinal cross-sectional view of a pass-through terminal of the transceiver adapter.

It is preferable to install a transmitter/transceiver adapter between the conventional electricity meter and the meter receptacle into which it is plugged and monitor consumption directly. Such a transceiver adapter 156 is illustrated in FIGS. 7 and 8 and comprises a generally circular, base in the form of a disc 158 having a circumference similar to that of the electricity meter and receptacle. Four connectors 160, equally-spaced from each other in a rectangular pattern extend through the disc 158 (a standard form IS/2 S Meter base). As shown in FIG. 7, each connector 160 has a prong portion 160*a* protruding from the rear of the disc 158 (i.e., which faces the receptacle when installed) and a bifurcated portion 160*b* protruding from the front of disc 158 to receive a corresponding prong (not shown) of the meter contact, ("supply" or "load" as the case may be). Two of the connectors 160, specifically their prong portions 160A, are each surrounded by a coil 162 which constitutes a secondary winding of a current transformer (the connector 160 being the primary "winding").

The pair of current transformers output currents proportional to the current flowing in the line connectors 160, i.e., through the meter. An AC/DC power module 164 has a first stage 164' which extracts power from the supply contacts and converts it to a relatively high DC voltage and a second stage 164" which reduces the DC voltage and uses it to supply a microcontroller 166, LAN and WAN data communications interfaces 168 and 170, respectively, external meter data interface 172, extended memory 174 and a load monitoring circuit 176. Whether the power supply 164' uses the "supply" contacts or the "load" contacts will depend upon local regulations which, in some cases, require power for the meter to be derived pre-meter and in other cases allow power to be derived post-meter.

The load monitoring circuit 176 is connected to the current transformer coils 162 and monitors both present voltage and present current in order to calculate a present aggregate power level which is converted to digital form (with a specialty hi-speed A to D) and supplied to the microcontroller 166. The latter conveys this information to the LAN interface 168 for transmission to the monitoring unit 100 via the dipole antenna.

Figure 9:
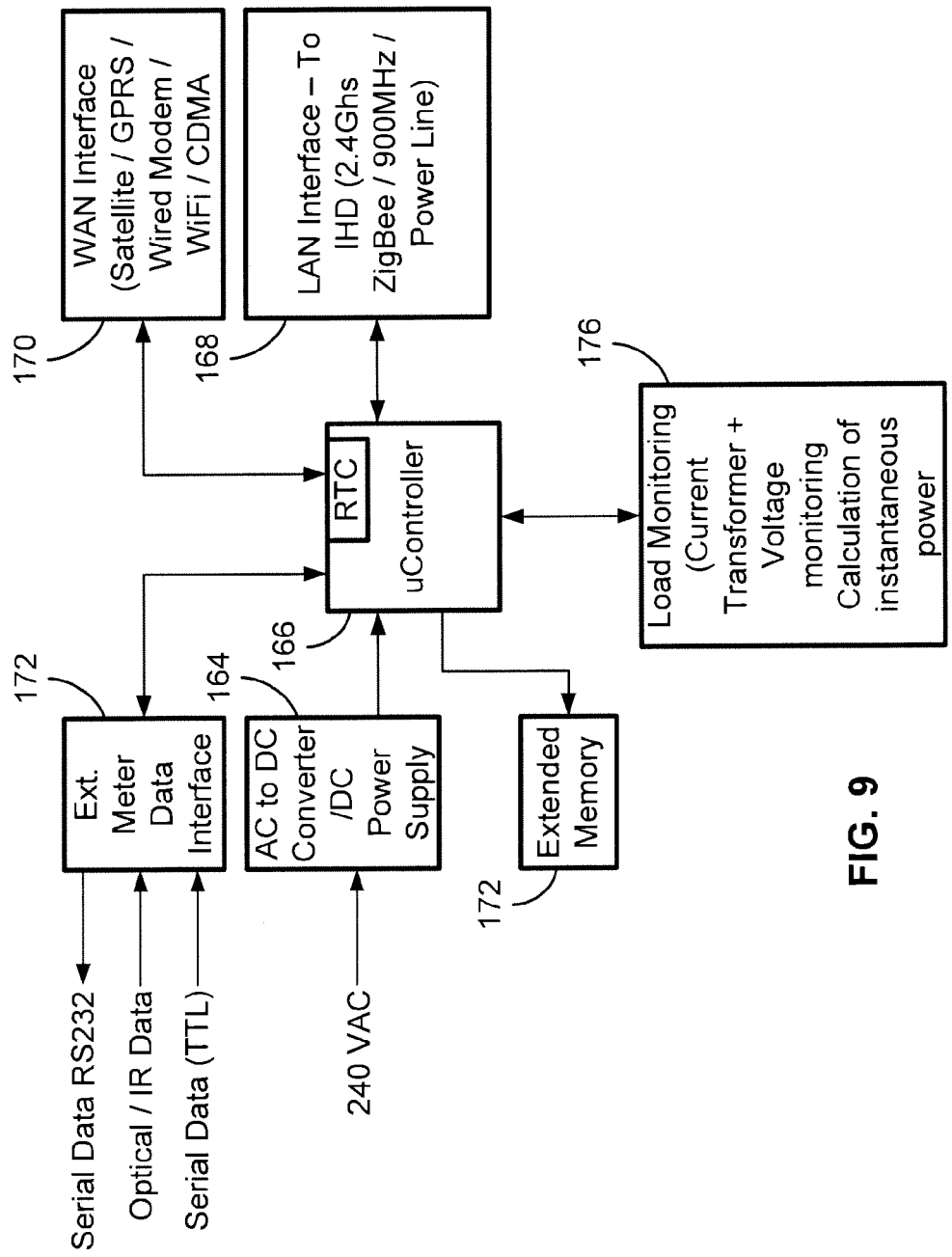
FIG. 9 is a schematic block diagram of the electrical components of the transceiver adapter of FIG. 7.

The transceiver adapter 156 can be used not only to transmit the usage metric information to the monitoring device 100, but also to a central repository or central database, such as at a utility or elsewhere by way of data interface 172 or WAN interface 170 with WAN dipole antenna 180, as appropriate. As indicated in boxes 168 and 170 of FIG. 9, any of a variety of data communications modes may be employed, such as GSM Cellular data (GPRS) modem WAN; WiFi 802.1 1b modem (2.4 GHz LAN); and/or Low Earth Orbit (LEO) ORBCOMM* satellites. Meter information may be sent in short bursts once a day to a ground relay station and from there via the Internet to a central server. Thus, the WAN transceiver 170 may have the following features: GSM communication, where available; WiFi in controlled corridors; LEO VHF 138-150 MHz band provides long-range communications even in challenging environments; CDMA communications; licensed SCADA Band (450 MHz typical) communication; simple installation—fits onto new or existing form 2 S meter socket; and low power consumption <0.6 watts.

Figures 21A, 21B:
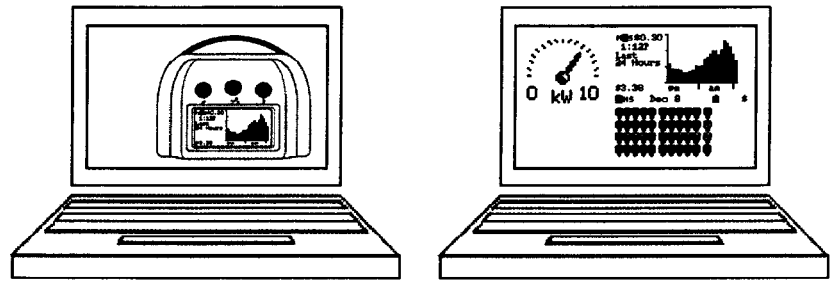
FIGS. 21A, 21B, 21C and 21D illustrate the use of a computer or handheld device to display an image representing a monitoring device of FIG. 1.
Figures 21C, 21D:
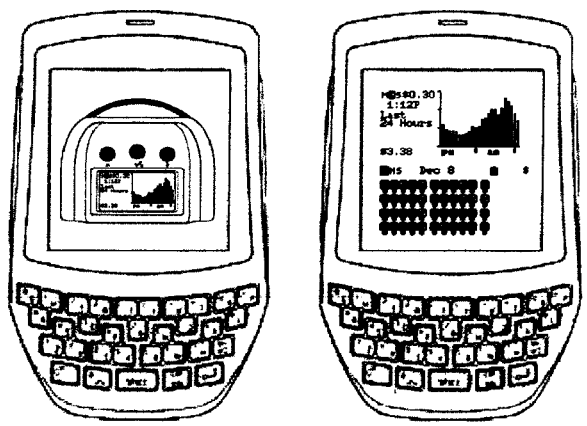

It is also envisaged that the monitoring device and/or the transceiver adapter 156 could supply the usage metric information to a personal computer in the building, or to a portable computer or to a Blackberry (trademark) or other similar hand-held device. The supplemental usage metric transmission could be displayed in such a way that it depicts the monitoring device 100. Thus, FIGS. 21A and 21B illustrate a personal computer displaying an image of the monitoring device with its illuminated display and data corresponding to its digital display based on meter readings communicated using the transceiver 104 of FIGS. 1 to 4 or, if preferred, the data interface 136. Likewise, FIGS. 21C and 21D illustrate a similar display on a Blackberry (Trademark) or other similar such device. In the latter case, the transmission might be routed via a server type system to create the graphics. Such transmission to a user device at a remote location could warn a parent, for example, of critical usage by other members of the family, for example children.

The invention embraces monitoring units having other configurations of illuminated display and, possibly, no second, digital display 110. Since a LCD display tends to be an expensive component, omitting it may provide an alternative lower cost option which still provides effective visual alerting when more detailed information is not required. Examples of these alternative embodiments of monitoring device will now be described with reference to FIGS. 10A to 20.

Figure 10A:
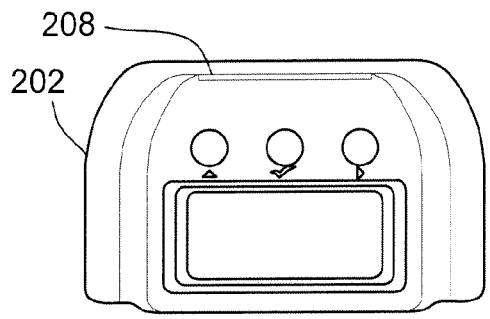
FIG. 10A is a front view of a monitoring device according to a second embodiment having a single straight display window.

Thus, FIG. 10A shows a monitoring device according to a second embodiment, which has an illuminated display, in the form of a straight, elongate window or lens 208 near the top of the casing 202. If desired, the window or lens 208 may be translucent or frosted to provide diffusion. The corresponding printed circuit board shown in FIG. 10B has a straight row of LEDs 220 which, when the board is installed will be aligned with window 208.

The single row of LEDs may be selected and driven to illuminate the window/lens 208 with one of red, orange/yellow and green light dependent on rate period, the illumination being scanned linearly across the window at a traverse rate dependent on, and indicative of, a rate of consumption; for example, by sequentially illuminating the linear array of LEDs.

Figure 11A:
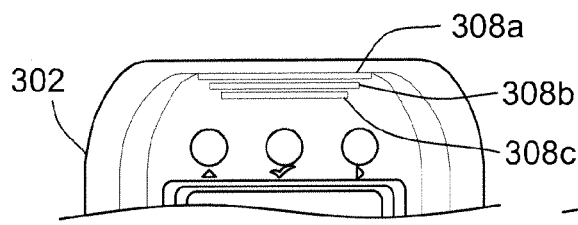
FIGS. 11A and 11B correspond to FIGS. 10A and 10B but for a third embodiment having three straight parallel display windows.
Figure 11B:
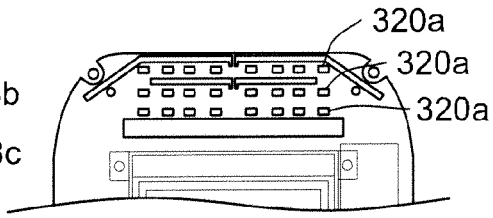

FIGS. 11A and 11B illustrate an embodiment in which the casing 302 is slotted to accommodate a display area comprising three straight elongate windows 308*a*, 308*b*, 308*c* in the casing for displaying, respectively, red, orange/yellow and green illumination provided by straight three rows of LEDs 320*a*, 320*b*, 330*c*, respectively, each row aligned with a respective one of the windows.

Figure 10B:
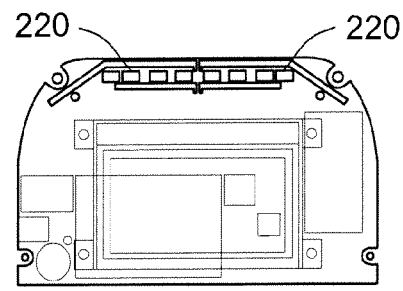
FIG. 10B schematically a circuit board of the monitoring device of FIG. 10A.
Figure 12A:
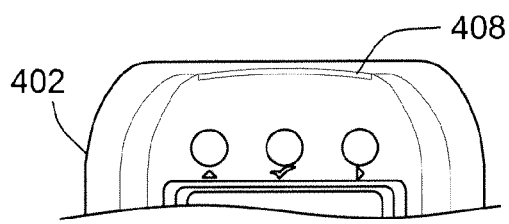
FIGS. 12A and 12B correspond to FIGS. 10A and 10B but for a fourth embodiment having a single arcuate display window.
Figure 12B:
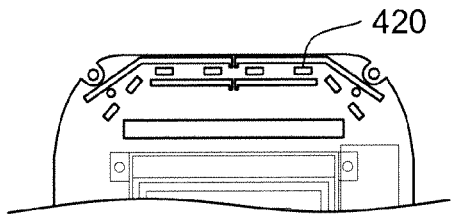

FIGS. 12A and 12B illustrate a monitoring device similar to that shown in FIGS. 10A and 10B but having a casing 402 in which the window or lens 408 is curved and the row of LEDs 420 is curved so as to align therewith.

Figure 13A:
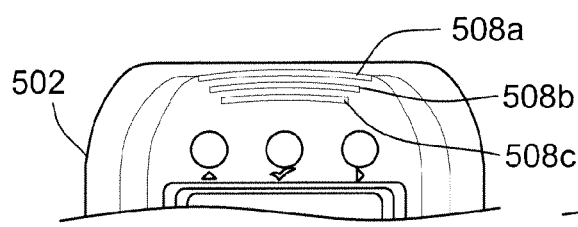
FIGS. 13A and 13B correspond to FIGS. 10A and 10B for a fifth embodiment having three arcuate parallel display windows.
Figure 13B:
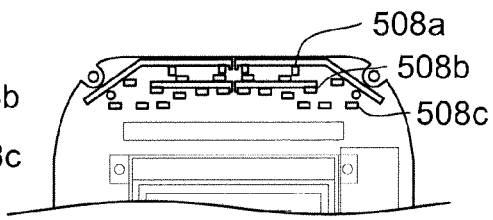

FIGS. 13A and 13B illustrate yet another embodiment, similar to the previous embodiment in which the casing 502 has a set of 3 linear windows 508*a*, 508*b*, 508*c*, but they are arcuate instead of straight and the corresponding LED array comprises three arcuate rows of LEDs, each aligned with a respective one of the windows.

Each of the monitoring devices shown in FIGS. 10A to 13B will have a LED controller similar to controller 142 of the first embodiment, but adapted to suit the particular array of LEDs. Likewise the programming of the microcontroller 130 would be modified as required.

Figure 22:
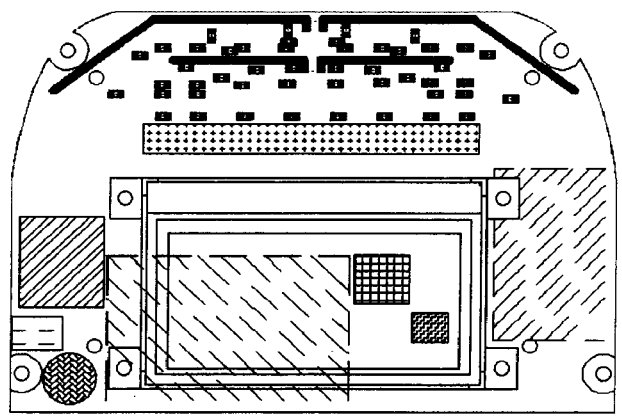
FIG. 22 illustrates schematically a printed circuit board that can be used with several different illuminated displays.

Each of the above-described embodiments having alternative display configurations has a circuit board carrying one array of LEDs arranged according to the configuration of the corresponding display, i.e., a different display will require a different circuit board. It is envisaged, however, that a single circuit board could be provided with several different arrays of LEDs each corresponding to a respective one of several different available displays. The LED controller and microcontroller then would be set to illuminate the appropriate one of the arrays according to the display type of the casing in which the circuit board is installed. Such a multipurpose printed circuit board is illustrated in FIG. 22 and has several arrays of LEDs each corresponding to a respective one of the LED arrays shown in FIGS. 10B, 11B, 12B and 13B enabling the same circuit board to be used with any one of the casings of FIGS. 10A, 11A, 12A and 13A simply by selecting the appropriate one of the LED arrays.

It should also be noted that, although the above-described embodiment uses bi-colour LEDs, the LED array may comprise, say, 6 to 10 individual coloured LEDs or groups of LEDs, arranged as previously described. Typical configurations may include bi-colour arrangements of red and green LEDs or tri-colour arrangements of red, green and blue (RGB) LEDs. Multiple LEDs may be pulsed simultaneously using different duty cycles and at different frequencies to provide a variety of colours, including white. In the latter, intensity and colour is controlled by varying pulse width modulation of the RGB LEDs which may be turned on and off in various sequences and at varying frequencies to provide different patterns of illumination in a selected colour to be displayed.

In the embodiments of FIGS. 10A to 13B, the light guide 118 (FIG. 1) is omitted and the illuminated display comprises an area of the window or set of windows or lenses (possibly of translucent material), through which the light from the array of LEDS passes through the casing without need for other optical components. Notwithstanding that, whether the display area comprises a translucent or frosted material or note, it may be illuminated indirectly using known optical arrangement of reflectors, prisms, light guides, optical fibers and the like.

Figure 14A:
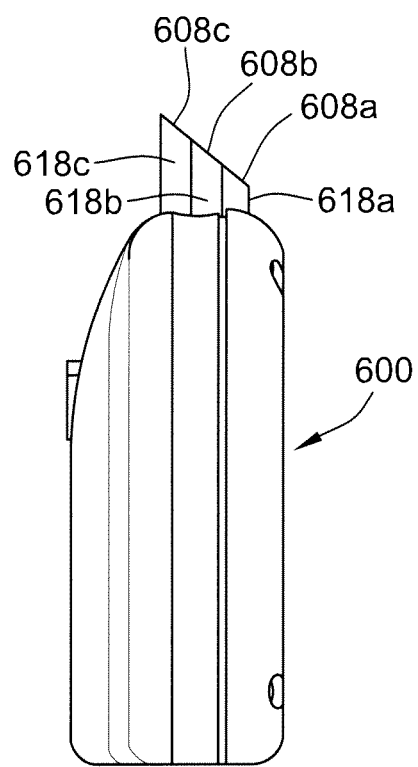
Figure 14B:
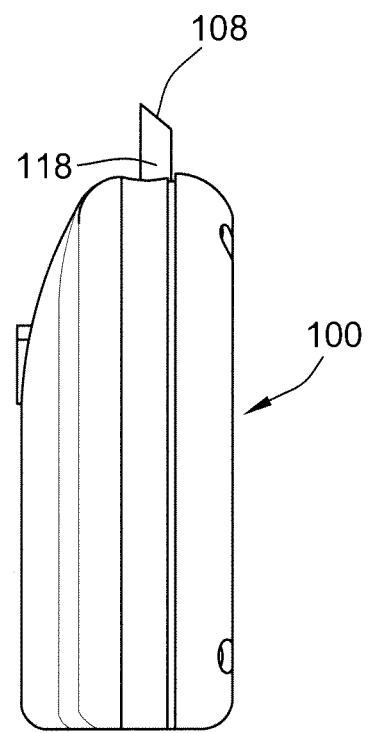
FIG. 14B shows, for comparison, a side view of the monitoring device of FIG. 1.

The embodiment shown in FIG. 1 uses a single light guide 118 having a display area in the form of an oblique surface 108. FIG. 14 shows a similar monitoring device 600 display comprising three similar light guides 618a, 618b, 618c of increasing radii sandwiched together so that the respective oblique display surfaces 608a, 608b, 608c form a stepped display. Each light guide is coupled to a row of LEDs of a different colour to the other so that three parallel bands of coloured light can be displayed in rainbow fashion. With this arrangement, the different colours could be turned on in succession to reflect changes in the tier or tariff while the illuminated area of each band could be scanned to indicate consumption rate. It will be appreciated that, instead of three light guides in parallel, the three oblique display surface could be formed by stepping the surface of a single, thicker light guide. Various other combinations could be conceived.

It will be appreciated that numerous arrangements for the configuration of the illuminated display are possible and the afore-mentioned examples are not intended to be limiting.

FIGS. 15(a) to 20 illustrate options for illumination of the different kinds of illuminated displays 108 and 608.

Figure 15A:
FIGS. 15A to 15C illustrates schematically sequential radial illumination of the three oblique surfaces of the monitoring device of FIG. 14 A.
Figure 15B:
Figure 15C:

Thus, FIGS. 15A to 15C illustrate illumination of the three oblique surfaces of the light guides 608 being illuminated in sequence, beginning with the radially innermost surface 608a. The same sequence could be applied to the monitoring devices 302 and 502 which have three windows rather than three light guide surfaces.

FIGS. 16A to 16F illustrate illumination of different parts or segments of the single light guide surface 108 to show a bead of light moving from one (left) end of the surface 108 to the other (right). If desired, the bead of light could be caused to travel to and fro, whether to continue showing consumption or, perhaps, to show that the monitoring device is in a different mode of operation, for example an initialization phase. The single window version of FIGS. 10A and 12A could be illuminated in a similar manner.

FIGS. 17a to 17F correspond to FIGS. 16(a) to 16(f) but depict successive parts of the single display being illuminated progressively to cause the length of the coloured portion of the display to increase from one (left) end towards the other (right) end.

Figure 16A:
FIGS. 16A to 16F illustrate sequential illumination of parts of the single display area of the monitoring device of FIG. 1 to produce the effect of a bead of light travelling along the arcuate display area.
Figure 16B:
Figure 16C:
Figure 16D:
Figure 16E:
Figure 16F:
Figure 17A:
FIGS. 17A to 17F illustrates schematically illumination of different parts of the single display area of the monitoring device of FIG. 1 to produce the effect of the length of a coloured portion of the arcuate display area increasing progressively.
Figure 17B:
Figure 17C:
Figure 17D:
Figure 17E:
Figure 17F:
Figure 18A:
FIGS. 18A to 18C illustrates schematically illumination of different parts of the single display area of the monitoring device of FIG. 1 to produce the effect of "bubbling" of a coloured portion of the arcuate display area from each side in a symmetrical manner.
Figure 18B:
Figure 18C:

FIGS. 18A to 18C illustrate schematically illumination of different parts of the single display area 108 of the monitoring device of FIG. 1 to produce the effect of "bubbling", i.e., similar to the illumination of FIGS. 16A to 16c producing a bead of light travelling from left to right and FIGS. 16F to 16D producing a bead of light travelling from right to left. The beads could either disappear when they meet in the middle, to start again at their respective ends, cross over; the cycle then repeating.

Figure 19:
FIG. 19 illustrates schematically simultaneous illumination of different parts of the single display area of the monitoring device of FIG. 1 with a portion of the arcuate display area that may be used in conjunction with FIGS. 15, 16 and 17.

It is also envisaged that the beads could create certain patterns. For example,

FIG. 19 illustrates simultaneous illumination of two different parts of the single display area 108 of the monitoring device of FIG. 1 spaced apart by a non-illuminated part of the arcuate display area 108, the two parts traversing the display area in a manner similar to that described with reference to FIG. 16.

Figure 20:
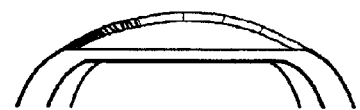
FIG. 20 illustrates schematically simultaneous illumination of adjacent parts of the single display area of the monitoring device of FIG. 1 with a portion of the arcuate display area in different selections of a plurality of colours that may be used in conjunction with FIGS. 15, 16 and 17.

Moreover, it would be possible to illuminate adjacent parts of the display area 108 with different colours, as illustrated in FIG. 20. The beads could be two or more beads with different ones of the plurality of colours—with or without separation using the "motion" or "filling" of FIG. 15 or 16.

FIGS. 21A, 21B, 21C and 21D illustrate the use of a computer or handheld device to display an image representing a monitoring device of FIG. 1; and data that would appear on the devices screen.

FIG. 22 illustrates schematically a printed circuit board that can be used with several different illuminated displays.

Beneficially the monitoring device may support TOU or non-TOU rate periods; Automated Meter Reading (AMR) which may be simplex receiving or two way or Advanced Meter Infrastructure (AMI) which is two way and may support data exchange beyond meter billing data.

Although each of the above-described monitoring devices has an internal dipole antenna, it could have an external antenna, either in addition or as an alternative. Where the monitoring device comprises a transceiver, it may also act to relay data to other devices, and may comprise a translator to translate data between different data formats and transmission protocols, facilitating operation in a number of modalities. The monitoring device may also receive signals from one or a plurality of other smart metering devices or systems, such as electricity, gas and water, and other services. The monitoring device may comprise more than one radio, or other hardware, software or firmware to facilitate data exchange between more than one system (different utilities or different types of devices) which may use different radio frequencies or protocols.

Where a plurality of devices are networked, updates may be obtained automatically through an Internet connection, USB, or utility broadcast, e.g., by ZigBee.

Where two-way messaging is provided, optional functions such as intelligent thermostat control may be provided, or messaging may be received from a utility company, which may include alarms to prompt the consumer to shut off appliances, such as an air conditioners during a critical period, or alerts warning of an imminent critical peak or other threshold conditions. Such alerts or alarms could be notified to the consumer by modulating the illuminated display and/or by means of the audible indicator, as previously mentioned.

A home may have a single meter with a transceiver which may be monitored in two or more locations—typically kitchen, laundry room and front door. Additionally, a PCT thermostat may communicate with the In-Home Display to duplicate a sub-set of use information, or to allow the In-Home Display to control the thermostat.

Some embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism.

The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks. This software embodiment will likely simulate the look and feel as well as function of the physical product. The software which, when loaded into a computer or handheld device, creates the two displays on screen and causes the control means (processor etc. inside the computer) to control the display to provide the two colours and the motion.

Therefore, where the monitoring device comprises a transceiver capable of transmitting usage data or information to another device, this information may be used to provide control of smart appliances, a thermostat, or other controller, or to relay information to a consumer, e.g. to a remote or hand held device to enable user intervention, for example where power consumption exceeds a threshold.

Furthermore other embodiments of in-home monitoring may be implemented in software, using a display, e.g. on a computer, graphical display or handheld device to provide a graphical indicator and an illuminated display showing a colour dependent on a cost of consumption and motion dependent on a rate of consumption.

It is envisaged that the LCD display could have a touch-sensitive screen and the push buttons 116 integrated into the LCD display in known manner

INDUSTRIAL APPLICABILITY

The monitoring device, system and method according to embodiments of the present invention provide improved or alternative ways for consumers to monitor usage of utilities, hi particular, the illuminated display which uses colour to indicate a present cost or rate period, and simulated movement which indicates a present rate of consumption provides "at a glance" monitoring of rate of consumption and present unit cost.

Scanning, sweeping motion or other motion (linear or rotational) of illumination of the display advantageously tends to catch the attention visually, without being as intrusive as flashing or blinking lights. Beneficially, a digital display may be offered with both the illuminated display and a digital display to provide more detailed alphanumeric or graphical information. Audible alerts may optionally be provided. Improved devices for in-home monitoring and display of real time usage assists in encouraging consumers to manage consumption and cost. Devices may offered to be compatible with a number of wired and wireless networking protocols, and preferably provide a digital display for providing more detail information, and a network connection for transferring data to a repository or other device for analysis. Lower cost and simpler displays, perhaps with an illuminated display only, may be deployed at multiple locations in the home, and conveniently networked directly or through the main monitoring device to receive information from a smart meter. They might also be networked through a consumer's home wireless network.

Each of the plurality of colours may represent a respective one of a corresponding plurality of different levels of funds available and the controller may cause the light source to illuminate different parts of the display sequentially at a rate indicative of present rate of consumption.

A monitoring device, system and method is provided for in-home or on-premises monitoring of the usage of utilities, such as electricity and other services. The monitoring device receives information from a smart metering system or transceiver, and displays current usage through an illuminated display, which displays a colour indicative of the current cost of consumption, and controls illumination of the display to simulate scanning, movement or rotation across the display at a traverse rate indicative of a rate of consumption or other usage parameter. The display therefore provides a consumer with immediate "at a glance" visual information on current usage. Optionally a digital display screen provides more detailed alphanumeric and graphical information, through a number of selectable display modes. Beneficially one or more devices may be networked, and interface directly or indirectly with a transceiver of a smart metering system, or a retrofit transceiver for a conventional meter. While particularly suited to electricity monitoring, monitoring of other utilities and services may alternatively or additionally be provided. The system may be used with a wired network or wirelessly networked by one of a number of standard wireless and mesh network communication protocols.

Although embodiments of the invention have been described in detail with respect to monitoring of usage of electricity, other embodiments of monitoring devices, systems and methods may be applicable to monitoring of other utilities, or services which are metered. Other embodiments may also be applicable to providing consumers with devices for visually monitoring usage of services such as bandwidth or other chargeable communications services which are subject to time of use dependent rates (i.e. weekday, weeknight or weekend or evening rates) or surcharges based on usage exceeding a threshold number of minutes or kWh.

Other advantageous display features may include: TOU period status, time to next period; comparable periods, monthly; prediction of kWh and $ to end of current period; voltage, high and low; KW peak draw; clock-updated by meter, 12 or 24 hour mode; connectivity to computer and or thermostat; ability to display water and gas readings in a more simplified form; messaging, Amber Alert, etc. from utility; two-way communication enabling the consumer to acknowledge receipt of a message, e.g. advising of a shut down time for a later period. Some of these features may require specific external network functionality. Others can be provided using wired communications or ZigBee. As more or different features/interpretations are available, the monitor can adapt using software, hardware and/or firmware updates.

The invention claimed is:

1. A monitoring device for monitoring usage of a commodity supplied by a utility and contemporaneously displaying at least two usage metrics on a portable computing device, comprising:

a receiver for receiving information relating to at least a first of said at least two usage metrics, said first usage metric relating to present consumption rate or aggregate consumption of the commodity; and a transmitter for transmitting said usage metrics by way of a wireless communications system to the portable computing device having a local display and a processor programmed to receive said at least two usage metrics and cause said local display to display a varying illuminated area whose colour and area variation are each indicative of a respective one of the at least two usage metrics.

2. A monitoring device according to claim 1 further comprising:

a display having a display area;

a light source for selectively illuminating at least part of the display area with light of a selected one of a plurality of colours and varying the illuminated area; and a controller responsive to the receiver for controlling the light source to select the illumination colour and to vary the illuminated area, the colour selection and area variation each being indicative of a respective one of the at least two usage metrics.

3. A monitoring device for monitoring usage a commodity supplied by a utility in communication with a controllable light source comprising:

a receiver for receiving information relating to at least a first of two usage metrics, said first usage metric relating to present consumption rate or aggregate consumption of the commodity; and a controller responsive to the receiver for remotely controlling a light source comprising an array of lights to select the illumination colour and to vary the illuminated area, the colour selection and area variation each being indicative of a respective one of the at least two usage metrics.

4. A software program executed on a portable computing device wirelessly coupled with a monitoring device, said monitoring device comprising:

a receiver coupled to the monitoring device for receiving information relating to at least a first of two usage metrics gathered by said monitoring device, said first usage metric relating to present consumption rate or aggregate consumption of the commodity; and a transmitter for transmitting said usage information to the portable computing device by way of a wireless communications system; and said portable computing device having a local display and a processor for receiving said usage information and in dependence upon said usage information causing said local display to display a varying illuminated area whose colour and area variation are each indicative of a respective one of the at least two usage metrics.

5. The portable computing device and monitoring device of claim 4 wherein said monitoring device further comprises:

a display having a display area;

a light source for selectively illuminating at least part of the display area with light of a selected one of a plurality of colours and varying the illuminated area; and a controller responsive to the receiver for controlling the light source to select the illumination colour and to vary the illuminated area, the colour selection and area variation each being indicative of a respective one of the at least two usage metrics.

6. A machine-readable medium carrying non-transitory software which, when loaded into a portable computing device, having a display and internal processor, programs the portable computing device to receive usage information from an in-building monitoring device for in-building monitoring of usage of a commodity supplied by a utility and contemporaneously displaying at least two usage metrics, and communicating usage information by way of a wireless communications system to the portable computing device, and said usage information causing the local display to display a varying illuminated area whose colour and area variation are each indicative of a respective one of the at least two usage metrics the displays on screen.

7. A method for monitoring usage of a commodity supplied by a utility and contemporaneously displaying in-building at least two usage metrics, comprising:

receiving information relating to at least a first of said at least two usage metrics, said first usage metric relating to present consumption rate or aggregate consumption of the commodity; and selectively illuminating at least part of a display area with light of a selected one of a plurality of colours and varying the illuminated area in a manner indicative of a respective one of the at least two usage metrics.

* * * * *